United States Patent
Alriksson et al.

(10) Patent No.: US 9,031,175 B2
(45) Date of Patent: May 12, 2015

(54) TECHNIQUE FOR AUTOMATIC GAIN CONTROL

(75) Inventors: Peter Alriksson, Hörby (SE); Joakim Axmon, Kävlinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/112,754

(22) PCT Filed: Apr. 13, 2012

(86) PCT No.: PCT/EP2012/056834
§ 371 (c)(1),
(2), (4) Date: Oct. 18, 2013

(87) PCT Pub. No.: WO2012/140231
PCT Pub. Date: Oct. 18, 2012

(65) Prior Publication Data
US 2014/0056395 A1   Feb. 27, 2014

Related U.S. Application Data

(60) Provisional application No. 61/480,066, filed on Apr. 28, 2011.

(30) Foreign Application Priority Data

Apr. 14, 2011   (EP) ..................... 11003166

(51) Int. Cl.
*H03G 3/20*   (2006.01)
*H03G 3/30*   (2006.01)

(52) U.S. Cl.
CPC ............... *H03G 3/20* (2013.01); *H03G 3/3073* (2013.01); *H03G 3/3078* (2013.01); *H04B 17/309* (2015.01); *H04B 17/318* (2015.01); *H04B 17/327* (2015.01); *H04B 17/382* (2015.01)

(58) Field of Classification Search
CPC ..... H03G 3/20; H03G 3/3073; H03G 3/3078; H04B 17/21; H04B 17/309; H04B 17/318; H04B 17/327; H04B 17/336; H04B 17/373; H04B 17/382

USPC ......... 375/147, 148, 219, 224, 226, 260, 316, 375/360, 362, 364, 340, 345; 370/208, 330, 370/332, 337, 347; 455/67.11, 67.16, 136, 455/138, 139
See application file for complete search history.

(56) References Cited

U.S. PATENT DOCUMENTS

2001/0048727 A1 * 12/2001 Schmutz et al. ............. 375/345
2004/0151264 A1 *  8/2004 Montojo et al. ............. 375/345
(Continued)

FOREIGN PATENT DOCUMENTS

CN   1757194 A1   4/2006
EP   1 239 606 A1   9/2002
(Continued)

OTHER PUBLICATIONS

3GPP TS 36.211 V8.5.0 (Dec. 2008), 3rd Generation Partnership Project; Technical Specification Group Radio Access Network; Evolved Universal Terrestrial Radio Access (E-UTRA); Physical Channels and Modulation (Release 8) consisting of 41-pages.
(Continued)

*Primary Examiner* — Young T Tse
(74) *Attorney, Agent, or Firm* — Christopher & Weisberg, P.A.

(57) ABSTRACT

A method of performing Automatic Gain Control, AGC, in a receiver of a device is provided. The device is served on a serving carrier of a multi-carrier communication network. Measurement gaps are scheduled on the serving carrier for inter-carrier measurements on a non-serving carrier. The method comprises the step of determining a first time interval, in which a predefined signal portion is transmitted on the non-serving carrier; the step of estimating, for the first time interval, received signal power on the non-serving carrier; the step of computing a receiver gain based on the estimate signal power; the step of performing, over a second time interval, an inter-carrier measurement on the non-serving carrier; and the step of applying the receiver gain to the receiver after the second time interval.

19 Claims, 7 Drawing Sheets

(56) References Cited

U.S. PATENT DOCUMENTS

| | | | |
|---|---|---|---|
| 2008/0165904 A1* | 7/2008 | Sidi et al. | 375/345 |
| 2008/0219332 A1* | 9/2008 | Brehler | 375/219 |
| 2010/0080327 A1* | 4/2010 | Zhang et al. | 375/345 |
| 2010/0248665 A1* | 9/2010 | Jonsson et al. | 455/140 |
| 2010/0265913 A1* | 10/2010 | Gorokhov et al. | 370/331 |

FOREIGN PATENT DOCUMENTS

| | | |
|---|---|---|
| EP | 1 583 232 A2 | 10/2005 |
| EP | 1583232 A2 | 10/2005 |
| EP | 2 367 385 A1 | 9/2011 |
| GB | 2 458 542 A1 | 9/2009 |

OTHER PUBLICATIONS

Extended European Search Report dated Sep. 14, 2011 for European Application No. 11003166.3-1246 consisting of 7-pages.
International Search Report and Written Opinion dated May 7, 2012 for International Application No. PCT/EP2012/056834, International Filing Date: Apr. 13, 2012 consisting of 14-pages.
Secretary TSG Geran et al., "Report of TSG Geran Meeting #38, version 0.0.1" 3GPP Draft; GP#38_Report_V001, 3rd Generation Partnership Project (3GPP), Mobile Competence Centre; 650, Route des Lucioles; F-06921, Sophia-Antipolis Cedex; France, vol. TSG Geran, No. Malaga; 20080512, Mar. 27, 2009, XP050448195 *p. 13, lines 25-lines 39* [Retrieved from the Internet Mar. 27, 2009] consisting of 45-pages.
1st EP Examination Report dated Apr. 25, 2013 for corresponding EP Application No. 11 003 166.3-1855 consisting of 7-pages.

* cited by examiner

TECHNIQUE FOR AUTOMATIC GAIN CONTROL

TECHNICAL FIELD

The present disclosure relates to automatically controlling the gain of a receiver. Particularly, the disclosure relates to automatic gain control in a multi-carrier communication network.

BACKGROUND

In communication networks, particularly wireless communication networks including Evolved Universal Terrestrial Radio Access Networks (E-UTRANs), signal power (also referred to as the signal level), which is proportional to the square of a field amplitude, can significantly and rapidly vary with time. Various mechanisms and models for describing such signal power variations are known, including slow and fast fading, Rayleigh fading, and Rician fading.

Many mobile communication networks, including Long Term Evolution, or LTE, networks based on E-UTRAN, have a cellular configuration. In a cellular network, a mobile terminal communicating via a base station of a first cell may need to search for a second cell, for example in a handover context. In an exemplary scenario, the mobile terminal departs from the first cell and approaches the second cell. Based on signal power detected by the mobile terminal, a base station controller can prepare and decide for a handover of the mobile terminal from the first cell to the second cell. In E-UTRAN and other cellular networks, the first cell, i.e., a Base Transceiver Station (BTS) of the first cell, is not transmitting to and/or expecting transmissions from the mobile terminal during a measurement gap, which allows the mobile terminal to search for the second cell.

Conventional receiver stages comprise an Automatic Gain Control (AGC). The AGC rapidly updates a gain of the receiver stage, which aims at minimizing quantisation noise in the receiver stage. Conventional AGC techniques as described in GB 2 458 542 A measure signal power during portions of a signal and continuously update the gain of the receiver, which is intended to optimize signal reception. EP 1 231 710 A2 describes an automatic gain control circuit operating in a "fast acquire" mode and a "slow track" mode. There also exists an AGC technique according to EP 1 583 232 A2, that stores a gain setting value for a transmission gap.

EP 1 239 606 A1 describes a technique of determining a reference value (RXLEV) during Automatic Gain Control of a general packet control channel, such as the Packet Common Control Channel (PCCCH) of the General Packet Radio Service (GPRS) system designed for the GSM mobile communication system. In a first time interval, one or two measurements are taken from time slots s1 and s2 preceding the PCCCH block to be received. In one embodiment, the RXLEV is calculated based on the measurements in the time slots s1 and s2. The RXLEV for the AGC is updated just before the reception of a new PCCCH block, i.e., a second time interval.

The conventional AGC techniques have been observed to exhibit a loss of measurement time available for cell search within the limited duration of the measurement gaps, which is 6 ms in the case of E-UTRAN. Furthermore, performing a cell search based on a stored gain value setting may fail because of an outdated stored gain value.

SUMMARY

Accordingly, it is an object to provide an AGC technique for improved efficiency of inter-carrier measurements.

According to a first aspect, a method of performing Automatic Gain Control, AGC, for a receiver of a device is provided. The device is served on a serving carrier of a multi-carrier communication network, wherein measurement gaps are scheduled on the serving carrier for inter-carrier measurements on a non-serving carrier. The method comprises determining a first time interval in which a predefined signal portion is transmitted on the non-serving carrier; estimating, for the first time interval, received signal power on the non-serving carrier; computing a receiver gain based on the estimated signal power; performing, over a second time interval, an inter-carrier measurement on the non-serving carrier, the first time interval and the second time interval are inside a same first measurement gap; and applying the receiver gain to the receiver after the second time interval.

Performing AGC for a receiver may encompass performing the AGC by means of an AGC unit coupled to the receiver. The method may (at least partially) be performed in the AGC unit. Alternatively or in addition, the method may (at least partially) be performed in the receiver.

The signal power estimate for the first time interval can be performed based on signal portions in the first time interval that are particularly suitable, relevant or reliable for computing the receiver gain. A precision, quality or reliability of the computed receiver gain thus can be improved. The first time interval may be determined so that the predefined signal portion is transmitted on the non-serving carrier or may be determined based on an assumption or expectation of such a transmission. The determined first time interval can be independent of the second time interval of the inter-carrier measurement. It is thus possible that the first time interval is not always lost for the inter-carrier measurement within the time limits defined for the measurement gaps.

The receiver gain application (also referred to as gain actuation) may include updating the receiver gain. By applying the receiver gain after the second time interval, it is possible not to affect the inter-carrier measurement by the receiver gain application. Specifically, applying the receiver gain to the receiver can involve an actuating phase. The receiver gain can comprise a set of receiver gain values. During the actuation phase, the gain may be applied in multiple places or stages (according to the multiple receiver gain values) through a receiver chain of the receiver. At one or more of the places or stages, the application can impair the received signal with, for example, DC transients and phase discontinuities. Such a perturbation of the inter-carrier measurement can be avoided by applying the receiver gain strictly after the second time interval.

Furthermore, applying the receiver gain can be excluded for one or all transmission symbols that are subject to or (relevant) part of at least one of the signal power estimate and the inter-carrier measurement. Applying the receiver gain can be limited to moments in time at which the impact of the impairments is limited or irrelevant. Preferably, receiver gain application is excluded (and postponed) for symbols comprising one or more reference signals. Alternatively or in addition, in the case of the non-serving carrier being structured in time by frames, such as slots or sub-frames in the case of E-UTRAN, the receiver gain application can be limited to frame borders, such as slot borders or sub-frame borders. Limiting the receiver gain application to frame borders, or to points in time outside the relevant part (such as a sub-frame comprising a reference signal), may further require that at least one of the serving carrier and the non-serving carrier are synchronized in time; and cells on the non-serving carrier are synchronized in time.

The receiver gain application can be aligned with frame borders. The receiver gain application needs not (always) be perfectly aligned with frame borders. As an example, in the case of Multicast Broadcast Single Frequency Network (MB-SFN) transmissions, the first OFDM symbol carries reference signals and the receiver gain is applied at a time outside the first OFDM symbol. Alternatively or in addition, limiting the receiver gain application to frame borders can be based on a synchronization signal detected on the non-serving carrier. Thus, receiver gain applications at undefined timing positions of the non-serving carrier or losses of relevant transmission symbols are avoidable.

The receiver gain can be applied after the second time interval by immediately applying the receiver gain at the end of the second time interval. Alternatively, the receiver gain can be applied not until the end of the second time interval. The receiver gain application can be postponed until the receiver gain application does not impact the performance of the inter-carrier measurements. A degrading of the performance of the inter-carrier measurements thus can be avoided.

The inter-carrier measurement can be an inter-frequency measurement. Alternatively or in addition, the inter-carrier measurement can be an inter-cell measurement and/or an inter-RAT measurement (wherein RAT abbreviates Radio Access Technology). More specifically, the inter-carrier measurement can include a Radio Resource Management (RRM) activity, e.g., at least one of a cell search and a Reference Signal Received Power measurement (RSRP measurement). As an advantage, a frequency of the receiver gain applications can be optimized with regard to both the performance of the inter-carrier measurements and compensation of large received signal power variations (at the receiver of the device due to fading and shadowing effects influencing the received signal power on the non-serving carrier).

The second time interval can adjacently follow the first time interval. Thus, components of the receiver (or the device) required in both the first and the second time interval need not be duplicated. As a general rule, the receiver gain application and the inter-carrier measurement can be "pipelined". Alternatively, the second time interval can fully encompass the first time interval. Thus, the inter-carrier measurement in the second time interval is not limited (in temporal extent) by the signal power estimate in the first time interval. As a further alternative, the first time interval and the second time interval can partially overlap. Thus, the first time interval can be temporally aligned or synchronized independently from the second time interval, and vice versa. Alternatively or in addition, a duration of at least one of the first time interval and the second time interval can be predefined (independent of the determination of a beginning of the first time interval or the second time interval).

The receiver gain can be applied to the receiver in a second measurement gap. The first measurement gap and the second measurement gap can be different (non-overlapping) measurement gaps.

The first measurement gap and the second measurement gap can be different measurement gaps scheduled on the (same) serving carrier. The second measurement gap can be any measurement gap scheduled on the serving carrier later than the first measurement gap. Particularly, the second measurement gap can be scheduled subsequent to (i.e., directly following) the first measurement gap on the serving carrier.

The first measurement gap and the second measurement gap may be temporarily separated by an intra-carrier reception. The intra-carrier reception can be multiple times longer than the (first or second) measurement gap. At least one of computing a receiver gain based on the estimated signal power (of the first measurement gap) and determining the first time interval (for the second measurement gap) can be performed in the (longer) time between the first measurement and the second measurement gap. As an example, the receiver gain may be applied to the receiver at the beginning of the second measurement gap. The second measurement gap can thus be fully available for the second time interval, i.e., for the inter-carrier measurement. Furthermore, the inter-carrier measurement can be performed based on the (latest) receiver gain (for the non-serving carrier). The method (in particular one or more of aforementioned method steps) can at least partially be repeated in the second measurement gap or in a different measurement gap. Particularly, applying a corresponding receiver gain to the receiver can be repeated in the second measurement gap or a different measurement gap. Each of the receiver gain application can occur at different time offsets. The different time offsets can be defined or measured relative to the corresponding measurement gap of the receiver gain application.

The first time interval is inside the first measurement gap. The first time interval can define a relative time frame relative to the first measurement gap. The relative time frame (defined for the first measurement gap) can define a relative time frame (by a beginning time offset and an ending time offset of the relative time frame) for the second measurement gap and/or any other measurement gap. The receiver gain can be applied to the receiver in the second measurement gap at a time offset (relative to the second measurement gap), which is outside the relative time frame (defined by the first time interval inside the first measurement gap). Symbols (such as OFDM symbols or any other encoded information) transmitted on the non-serving carrier in the first time interval can be relevant or significant for both the signal power estimate and the inter-carrier measurement. The corresponding symbols in the second measurement gap (i.e., the symbols in the relative time frame used for the second measurement gap) thus can be received and/or evaluated without being affected by the receiver gain application. Moreover, the step of determining the first time interval thus may not need to be repeated in the second measurement gap (or for all measurement gaps). Defining the relative time frame (relative to the measurement gaps) is advantageous in the case of periodic measurement gaps (scheduled on the serving carrier) and/or in the case the serving carrier and the non-serving carrier are synchronized.

The first measurement gap and the second measurement gap can be scheduled consecutively on the serving carrier (i.e., without a further measurement gap scheduled in-between the first and the second measurement gap). The receiver gain application in the second measurement gap based on the signal power estimate in the first gap thus may be more accurate.

The predefined signal portion can be any signal portion representative of the received signal power on the non-serving carrier. As an example, the predefined signal portion can comprise at least one of a reference signal (of the non-serving carrier) and a synchronization signal (on the non-serving carrier). The predefined signal thus can be determined based on signalling protocols or signalling parameters received on or derived from the non-serving carrier. Furthermore, the predefined signal portion can be determined (without further knowledge of the non-serving carrier) exclusively based on assumptions regarding at least one of the non-serving carrier (which is synchronized with the serving carrier) and a signalling protocol (or a signalling schedule) of the non-serving carrier.

The method can further comprise (e.g., at the beginning of one or all measurement gaps) the step of tuning the receiver to another carrier frequency other than the one of the serving carrier. Alternatively or in addition, the method can comprise (e.g., at the beginning of one or all of the measurement gaps) the step of switching to another radio access technology other than the one of the serving carrier. The device thus can search for cells and/or access the non-serving carrier at a different carrier frequency. Alternatively or in addition, the device (or the receiver) can selectively communicate via multiple radio access technologies. A robustness of the communication (at a higher level of the signalling protocol) thus can be improved.

Performing the inter-carrier measurement can include the step of sampling signals received on the non-serving carrier. The sampled signals can be subject to a preselection, which allows reducing a memory requirement of the device. In addition, the sampled signals can be buffered for (later) cell search evaluation. A workload of computational resources thus can be balanced. The computational resources can be used more efficiently in the step of computing the receiver gain or in a further step of evaluating the inter-carrier measurement, e.g., by queuing the computation or evaluation. The sampled signals can comprise reference signals (of the non-serving carrier).

The method can further comprise the step of applying an initial receiver gain (e.g., immediately) prior to performing the inter-carrier measurement. The inter-carrier measurement thus can be based on the (latest) receiver gain or a predefined initial receiver gain (for an initial measurement gap or after an initial tuning to the non-serving carrier). Alternatively or in addition, a further inter-carrier measurement can (immediately) follow the application of the receiver gain.

The technique presented herein may be realized in the form of software, in the form of hardware, or using a combined software/hardware approach. As regards a further aspect, a computer program product comprising program code portions for performing the steps presented herein when the computer program product is run on the served device or on at least one other computing device is provided. The computer program product may be stored on a computer-readable recording medium such as a memory chip, an optical recording medium and a hard disk. Moreover, the computer program product may be provided for a download onto such a recording medium.

According to a still further aspect, a device for performing Automatic Gain Control, or AGC, for a receiver is provided. The device is served on a serving carrier of a multi-carrier communication network and measurement gaps are scheduled on the serving carrier for inter-carrier measurements on a non-serving carrier. The device comprising a determination unit configured to determine a first time interval in which a predefined signal portion is transmitted on the non-serving carrier; an estimation unit configured to estimate, for the first time interval, received signal power on the non-serving carrier; a processing unit configured to compute a receiver gain based on the estimated signal power; a measurement unit configured to perform, over a second time interval, an inter-carrier measurement on the non-serving carrier, the first time interval and the second time interval are inside a same first measurement gap; and an application unit configured to apply the receiver gain to the receiver after the second time interval.

Each feature mentioned with regard to the above method can have a corresponding implementation in the device, and vice versa. Particularly, all units or at least one of the units (as mentioned above) can be operated in more than one of the measurement gaps. As an example, the application unit is operated in a second measurement gap or any other measurement gap. The application unit can be further adapted to apply a corresponding receiver gain to the receiver in the second measurement gap (or corresponding receiver gains in each of the different measurement gaps). Each of the applications can occur at a different time offset relative to the corresponding measurement gap of the application. A repeated perturbation or loss of a signal on the non-serving carrier (relevant for the inter-carrier measurement) due to the receiver gain application may thus be avoided.

BRIEF DESCRIPTION OF THE DRAWINGS

Further aspects and advantages of the technique presented herein will become apparent from the following description of preferred embodiments and the drawings, wherein FIG. 1 schematically illustrates a device embodiment in a multi-carrier communication network.

DETAILED DESCRIPTION

In the following description of preferred embodiments, for purposes of explanation and not limitation, specific details are set forth, such as particular signal processing components and sequences of steps, in order to provide a thorough understanding of the present invention. It will be apparent to one skilled in the art that the technique described herein may be practised in other embodiments that depart from these specific details. For example, while the following embodiments will primarily be described in context with an OFDM-compliant receiver stage, the present invention can also be implemented in other receiver stages of multi-carrier communication networks. While the embodiments relate to an exemplary LTE implementation, it will be readily apparent that the technique described herein may also be implemented in other mobile and stationary communication networks, including UMTS networks and LTE-Advanced networks.

Moreover, those skilled in the art will appreciate that the services, functions and steps explained herein below may be implemented using software functioning in conjunction with a programmed microprocessor, an Application Specific Integrated Circuit (ASIC), Digital Signal Processor (DSP) or a general purpose computer. It will also be appreciated that, while the following embodiments will primarily be described in context with methods and devices, the invention may also be embodied in a computer program product as well as in a system comprising a computer processor and memory coupled to the processor, wherein the memory is encoded with one or more programs that may perform the services, functions and steps disclosed herein.

Figure 1:
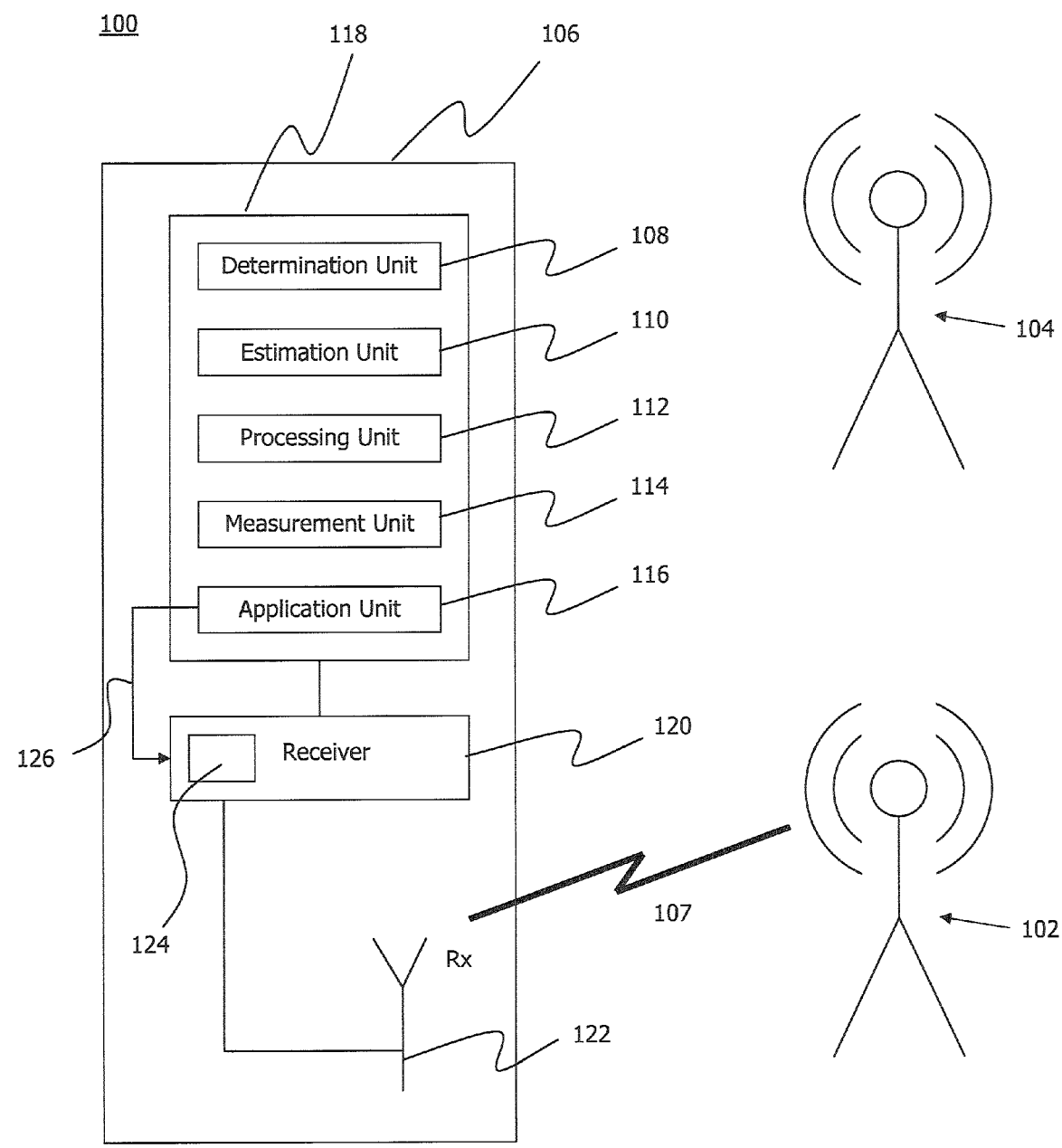

An embodiment of a multi-carrier communication network 100 is shown in FIG. 1. The communication network 100 comprises a first carrier 102, a second carrier 104, and a mobile or stationary device 106. The device 106 is served by the first carrier 102 (also referred to as a serving carrier) of the multi-carrier communication network 100. To this end, wireless communication link 107 has been established between the device 106 and the serving first carrier 102. The second carrier 104 provides an alternative communication path for the device 106. No communication link has yet been established with the second carrier 104 (also referred to as a non-serving carrier in relation to the device 106).

In the multi-carrier communication network 100 shown in FIG. 1, the first carrier 102 and the second carrier 104 are transmitted by a first and second base station (Base Transceiver Station or BTS), respectively. Each base station covers a cell of the multi-carrier communication network 100. In the exemplary context of E-UTRAN, the base stations may be Evolved Node Bs (eNBs). The device 106 may be a User Equipment, or "UE", according to the LTE standard. The first carrier 102 and the second carrier 104 operate (on the same carrier frequency) in a spatial diversity scheme using Space-Frequency Orthogonal Frequency-Division Multiplexing (SF-OFDM). In an alternative multi-carrier network 100, the first carrier 102 operates according to the LTE standard and the second carrier operates (on a different carrier frequency) according to the UMTS or any other standard.

The multi-carrier communication network 100 periodically schedules measurement gaps having a duration of, for example, 6 ms on the serving first carrier 102. During the measurement gaps, the first base station (of a first cell) is not transmitting to and/or expecting transmissions from the mobile terminal (which state is sometimes imprecisely referred to as the corresponding carrier or the corresponding cell being "muted"). In each of the measurement gaps, the device 106 can perform an inter-carrier measurement on one or more non-serving carriers, such as the second carrier 104. The inter-carrier measurements include, e.g., searching for one or more further (or alternative) cells (that have not yet been detected by the device 106). The inter-carrier measurements further include, e.g., measuring a signal power of one or more (previously detected) cells (including both serving and non-serving carriers, on which the one or more previously detected cells transmit). The measured signal powers may serve as a basis for a handover decision.

The device 106 comprises a determination unit 108, an estimation unit 110, a processing unit 112, a measurement unit 114, and an application unit 116. The receiver 120 is coupled to a (receiving) antenna 122 and adapted to convert an analogue signal from the antenna 122 to a digital signal represented by the IQ samples. Analog signal reception and the analog-to-digital conversion are based on a receiver gain. The receiver gain is defined by a set of gain values stored in a receiver gain memory 124 of the receiver 120.

The units 108 to 116 are grouped to form an AGC unit 118 in the embodiment shown in FIG. 1. The AGC unit 118 is connected to a receiver 120 of the device 106. The AGC unit 118, in particular the estimation unit 110 and the measurement unit 114, are adapted to receive IQ samples from a receiver 120. An imaginary part and real part of the IQ sample are also referred to as an I-component and an Q-component, respectively. In other words, the I-component and the Q-component represent a sine-component and a cosine-component on a sub-carrier corresponding to the Resource Element, respectively.

The application unit 116 is coupled to the receiver 120 by a feedback line 126. The application unit 116 is adapted to output the receiver gain on the feedback line 16 to the receiver 120. The receiver 120 is adapted to update the set of receiver gain values in the receiver gain memory 124 in response to and according to the receiver gain from the application unit 116. Thus, the application unit 116 applies the receiver gain to the receiver 120 by applying a signal indicative of the receiver gain on the feedback line 16. The measurement unit 114 is adapted to perform an inter-carrier measurement on the second non-serving carrier 104 (within each of the measurement gaps scheduled on the first serving carrier 102) based on the applied receiver gain.

In an alternative embodiment of the device 106, the units 108 to 116 are comprised in the receiver 120. Preferably, the units 108 to 116 (of the AGC unit 118) are distributed along a receiver chain as part of the receiver 120. The application of the receiver gain to the receiver 120 entails (or includes) updating each of the set of receiver gain values. Each of the receiver gain values is a parameter of signal reception or signal processing in the receiver chain. The application of the receiver gain thus implies a change of the receiver chain (in the receiver 120) at multiple places or stages.

Automatic Gain Control, or AGC, by the AGC unit 118 comprises the three steps of estimating signal power (also referred to as measuring signal power), computing a receiver gain, and applying the computer gain. For a reliable estimate of the received signal power, the received signal (on which the estimate is based) is representative of signals to be received (in the inter-carrier measurement) or the received signal is representative of received signal power (of the signal to be received in the inter-carrier measurement). The step of estimating signal power analyses the IQ samples of the receiver 120. The sum of squared I- and Q-components of the IQ samples are averaged, typically over 100 ms. Estimating signal power (for updating the receiver gain) may be performed in the time-domain. For the different step of performing the inter-carrier measurement, such as the RSRP measurement, it is noted that the inter-carrier measurement is based on a summation over time and frequency of resource elements that carry reference signals. The (running) average provides an estimate of the received signal power. In the computation step, the receiver gain is determined based on the estimate. In the application step (also referred to as receiver gain actuation), the receiver gain is applied to the receiver 120, specifically to the receiver chain in the receiver 120.

For a downlink channel, in the exemplary case of E-UTRAN radio frames are periodically transmitted on the first carrier 102 and the second carrier 104. The transmissions on the carriers 102, 104 can be synchronized (e.g., in the case of spatial diversity). Generally, a frame timing of different carries or the transmission on different carries is asynchronous (e.g., in the case of different network technologies such as LTE and UMTS). In the context of LTE, each of the radio frames comprises ten sub-frames. A sub-frame comprises two slots of 0.5 ms duration. Each of the slots comprises seven (or six) OFDM symbols. One sub-frame thus covers a time of 1 ms, and one radio frame lasts 10 ms.

The AGC unit 118, specifically the determination unit 108, is adapted to exclude certain sub-frames for estimating the signal power. E.g., some sub-frames might be allocated to Multicast Broadcast Single Frequency Network (MBSFN) transmissions. Moreover, in the case of a Time Division Duplex (TDD) communication, some sub-frames are allocated for uplink transmission. Sub-frames allocated for uplink transmission are not used to estimate the signal power of downlink sub-frames. Signals in the MBSFN sub-frames are also not representative of signals (relevant) for the inter-carrier measurement. E.g., the non-serving second carrier 104 may use the MBSFN sub-frames for power saving. Thus, no or very low signal power can received in the MBSFN sub-frames. The device 106, more specifically the AGC unit 118, thus limits estimates of received signal power to certain suitable time intervals. The determination unit 108 is adapted to determine such a first time interval, in which a predefined signal portion representative of the received signal power of an inter-carrier measurement is transmitted.

As an example of a channel structure used in the Long Term Evolution (LTE) standard of the 3rd Generation Partnership Project (3GPP), in frequency space, a Resource Block comprises twelve sub-carriers. A downlink channel comprises up to 100 Resource Blocks. Reference symbols are transmitted on a predefined subset of subcarriers in the first OFDM symbol and the fifth OFDM symbol (out of the 7 OFDM symbols in one slot). The reference symbols are transmitted (on the downlink channel) as a basis of estimating channel coefficients and for determining gain and weight coefficients in the device 106. For Frequency Division Duplex (FDD) systems, synchronization symbols are transmitted in the first and sixth sub-frame (i.e., the sub-frames numbered by 0 and 5 out of the 10 sub-frames in one radio frame) in the sixth OFDM symbol and the seventh OFDM symbol (out of the 7 OFDM symbols of the first slot). A slightly different definition applies for Time Division Duplex (TDD) systems.

In order to cope with rapid power variations in time, it would be possible to estimate the received signal power on the non-serving carrier and to frequently apply the receiver gain to the receiver 120. Frequent receiver gain applications can solve the problem with rapid power variations. Frequent receiver gain applications, however, degrade the inter-carrier measurement. For example, some of the receiver gain applications coincide with OFDM symbols relevant for the inter-carrier measurement. The application unit 116 is adapted to determine a time for the receiver gain application that does not affect symbols (or other signal portions) relevant to the inter-carrier measurement. Specifically, the application unit 116 is adapted to postpone the receiver gain application until the inter-carrier measurement has ended or is interrupted. The operation of the application unit 116 in conjunction with the other units is described in more detail in the context of following method embodiments.

Figure 2:
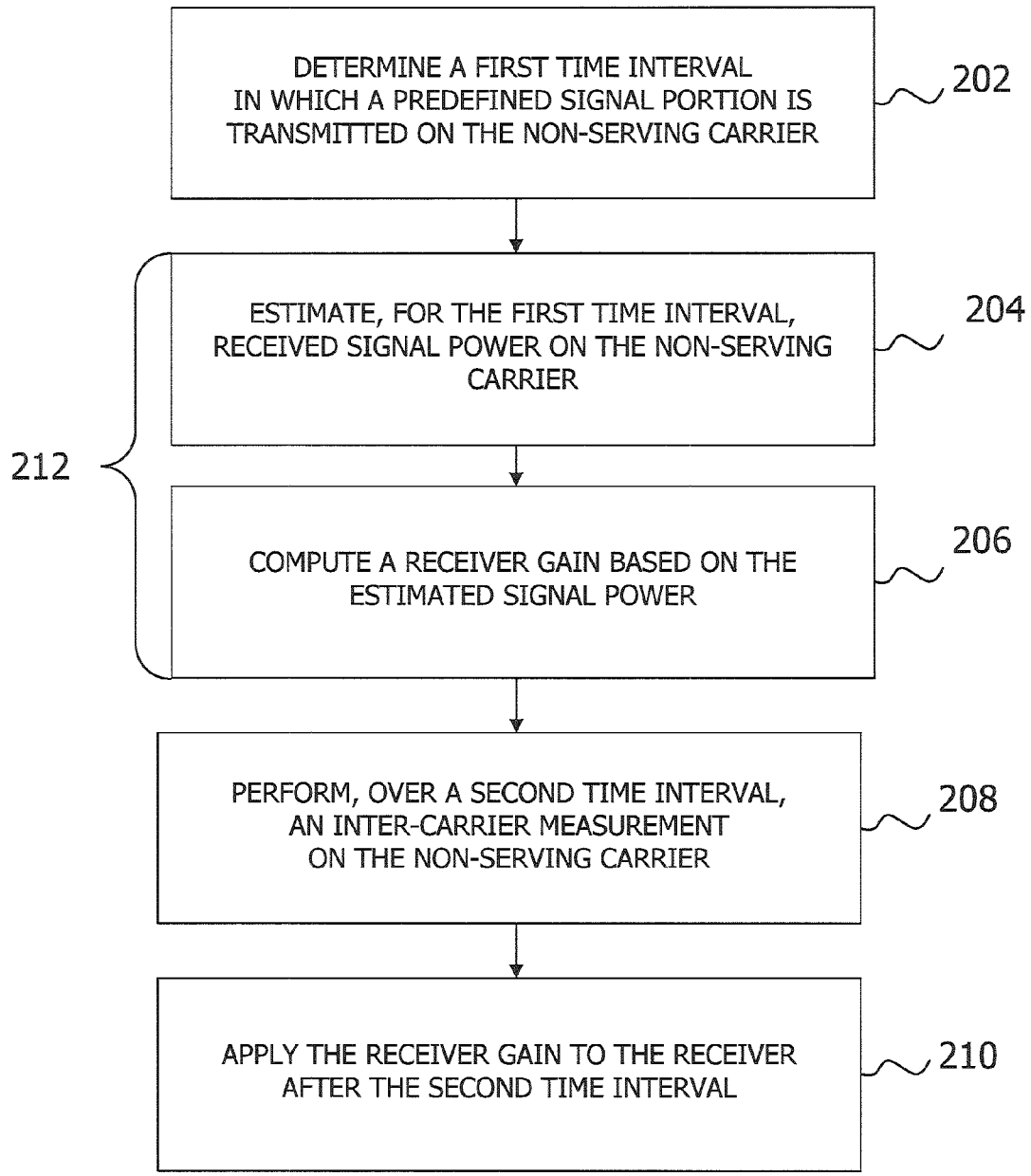
FIG. 2 shows a flow diagram of a method embodiment executable by the device of FIG. 1.

FIG. 2 shows a flow diagram 200 of an embodiment of a method for performing Automatic Gain Control (AGC) in a receiver, such as the receiver 120 of the device 106 shown in FIG. 1. In a step 202, a first time interval is determined, in which a predefined signal portion is transmitted on a non-serving carrier (such as the second carrier 104 shown in FIG. 1). Based on the IQ samples of the receiver 120 received within the first time interval, the received signal power on the non-serving carrier is estimated in a step 204. A receiver gain is computed by the processing unit 112 based on the estimated signal power in a step 206. The measurement unit 114 performs an inter-carrier measurement on the non-serving carrier 104 over a second time interval in a step 208. The steps 206 and 208 can at least partially overlap. Typically, the inter-carrier measurement in step 208 lasts longer than a computation time required in step 206. The step 206 is thus performed in parallel to the step 208. According to step 210, the receiver gain is applied by the application unit 116 to the receiver 120 after the second time interval.

The steps 204 and 206 are (collectively) referred to as an AGC algorithm 212. The inter-carrier measurement of step 208 includes temporarily storing the IQ samples (resulting from the analog-to-digital conversion performed by the receiver 120 based on the receiver gain according to the receiver gain memory 124).

Figure 3:
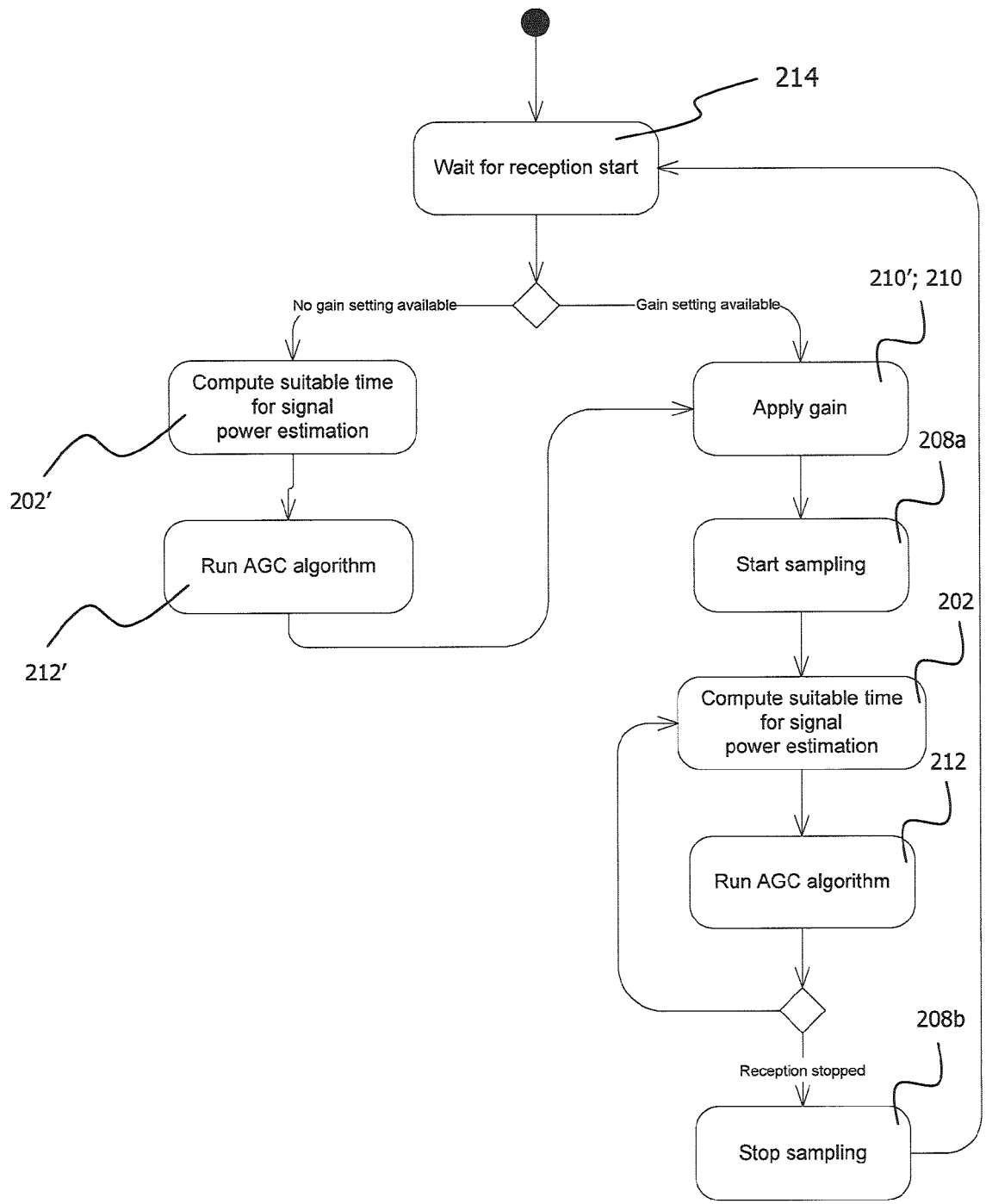
FIG. 3 shows a more detailed flow diagram of a method embodiment related to the embodiment of FIG. 2.

FIG. 3 shows the method illustrated in FIG. 2 in a wider context, also including a repetition of one or more steps of the method of FIG. 2. At the beginning of the second time interval the sampling is started in a sub-step 208a (of the step 208). The second time interval ends in a sub-step 208b (of the step 208) of stopping the sampling. The sub-steps 208a and 208b are shown in a more detailed flow diagram in FIG. 3.

As is shown in FIG. 3, performing Automatic Gain Control further includes a step 214 of waiting for signal reception on the non-serving second carrier 104 to start. The step 214 can include waiting for a confirmation signal indicative of an end or an interruption of the intra-carrier measurement on the serving first carrier 102. The step 214 can further include tuning the receiver 120 to another carrier frequency corresponding to the non-serving second carrier 104 (in the case of different carrier technologies, as mentioned above with reference to FIG. 1). The start of the signal reception is signalled by the receiver 120 to the AGC unit 118, particularly to the determination unit 108.

In case no gain setting is available, i.e., the receiver gain memory 124 in the receive 120 does not comprise a set of receiver gain values specific for the non-serving second carrier 104, a step 202' of determining an initial time interval is performed. The step 202' is analogous to the step 202 of determining the first time interval. In the initial time interval, a predefined signal portion is transmitted on the non-serving second carrier 104. The predefined signal portion in the initial time interval (determined in the step 202') and the predefined signal portion in the first time interval (determined in the step 202) include reference signals of the non-serving second carrier 104. The step 202' includes computing an initial time and an ending time of the initial time interval (for the initial signal power estimation). An initial AGC algorithm is performed in step 212' for the initial time interval determined in the step 202'. The step 212' of performing the initial AGC algorithm comprises a step 204' of estimating the received signal power on the non-serving second carrier 104 (wherein the step 204' not shown in FIG. 3 corresponds to the step 204 in FIG. 2 when applied for the initial time interval). The step 212' further comprises computing an initial receiver gain based on the estimated signal power in a step 206' (not shown and corresponding to the step 206 in FIG. 2). Each of the steps 202', 204', and 206' is (also) performed by the AGC unit 118. More specifically, the steps 202', 204', and 206' are (also) performed by the determination unit 108, the estimation unit 110, and the processing unit 112, respectively. Based on the initial receiver gain computed in the step 206' (as part of the step 212'), the computed receiver gain is applied to the receiver 120 in a step 210' (which is analogous to the step 210).

In the step 208a, the measurement unit 114 triggers the receiver 120 to provide the IQ samples. In the step 208b, the measurement unit 114 triggers the receiver 120 to stop the sampling. The step 208 of performing the inter-carrier measurement on the non-serving second carrier 104 in the second time interval thus covers a time period further comprising the steps 202 and 212. The step 202 of determining the first time interval is triggered by the starting of the sampling. The step 202 includes computing a starting time and an ending time for the first time interval. In one embodiment, the timing of the first time interval may be computed so as to cover a transmission of synchronization signals (in addition to the reference signals).

In the multi-carrier communication network 100 according to the LTE standard, the synchronization signals include primary synchronization signals (on a primary synchronization channel, or P-SCH, of the non-serving second carrier 104) and secondary synchronization signals (on a secondary synchronization signal, or S-SCH, of the non-serving second carrier 104). An allocation of Resource Elements in time and frequency for the synchronization channels will be described below with reference to FIG. 4.

The received signal power estimated (or measured) on the non-serving carrier is based on the IQ samples received in the step 204 (as part of the AGC algorithm 212) by the receiver 120 within the first time interval. Based on the receiver gain computed in the step 206 (as part of the AGC algorithm 212), a precision (or a reliability) of the receiver gain is increased by repeating the steps 202 and 212. The steps 202 and 212 are repeated as long as a signal is received by the receiver 120 on the non-serving second carrier 104. In response to the receiver 120 signalling that the signal reception on the non-serving second carrier 104 has stopped, the sampling (of the IQ samples) is stopped in the sub-step 208b. The sub-step 208b thus defines an endpoint of the second time interval of performing the inter-carrier measurement on the non-serving second carrier 104 according to the step 208. The method returns to the step 214 of waiting for a further signal reception on the non-serving second carrier 104. The further signal reception can be resumed either within the same measurement gap or in a subsequent measurement gap.

FIGS. 4 to 7 schematically illustrate temporal sequences as a result of performing by the device 106 the method embodiments illustrated in FIGS. 2 and 3. An operation sequence 216 illustrates a state of the receiver 120 and a temporal order of signal reception at the receiver 120. Dashed areas in the operation sequence 216 indicate an intra-frequency signal reception 218. During the intra-frequency signal reception 218, the receiver 120 receives signals from the serving first carrier 102. The intra-frequency signal reception 218 is based on an intra-frequency receiver gain, which is separately stored in the receiver gain memory 124 (and exclusively applied for the intra-frequency signal reception).

At the beginning of a first measurement gap 220, the receiver 120 is tuned to a different carrier frequency used by the non-serving second carrier 104. A radio switching time 222 required for changing the radio frequency of the receiver 120 (until signal reception is established on the non-serving second carrier 104) is indicated in the operation sequence 216 by vertical bars. The total time scheduled by the multi-carrier communication network 100 for the first measurement gap 220 is 6 ms. The receiver 120 returns to the radio frequency of the serving first carrier 102 within a return radio switching time 224. The return radio switching time 224 is initiated prior to the end of the first measurement gap 220, such that the receiver 120 has reestablished signal reception (on the serving first carrier 102) by the end of the first measurement gap 220. The intra-frequency signal reception 218 (i.e., signal reception on the serving first carrier 102) thus continues immediately after the end of the first measurement gap 220.

The multi-carrier communication network 100 periodically schedules measurement gaps. A second measurement gap 226 is illustrated on the operation sequence 216 in FIG. 4. The measurement gaps 220 and 216 are equal in duration. Radio switching 228 and return radio switching 230 are analogous to the first measurement gap 220. Effective measurement times 232 and 234 (indicated in white on the operation sequence 216 of FIG. 4) for the receiver 120 receiving signals on the non-serving second carrier 104 are thus reduced by the time required for radio switching.

Figure 4:
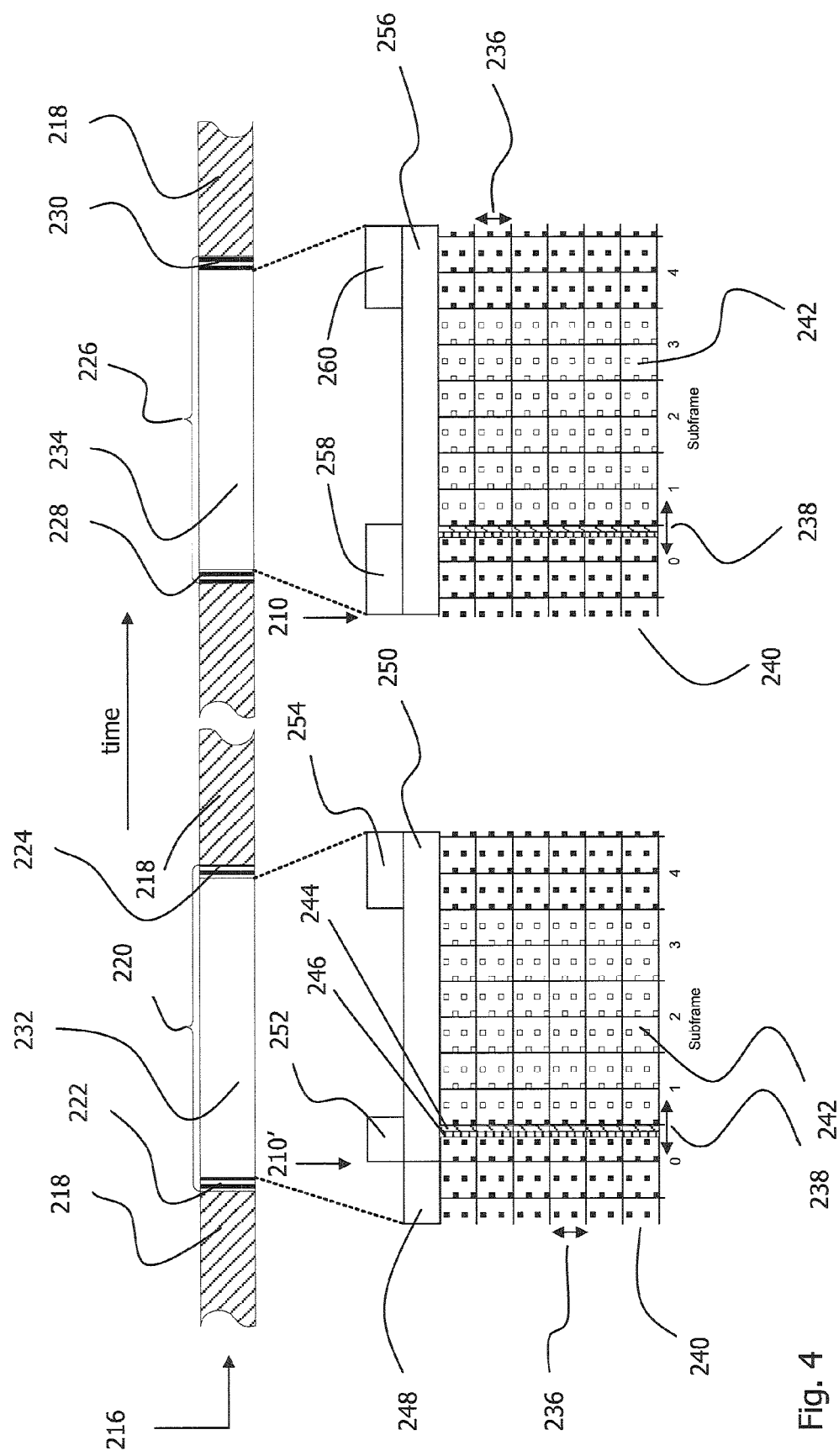
FIG. 4 schematically illustrates time-frequency grids of a Frequency Division Duplex carrier at a first timing relative to measurement gaps.

Time-frequency grids of the inter-carrier measurements (during the effective measurement times 232 and 234, respectively) are illustrated in the lower half of FIG. 4. The time-frequency grids show time on the horizontal axis and frequency (i.e., the sub-carries bundles into Resource Blocks) on the vertical axis. The grid comprises six Resource Blocks 236 in the frequency direction. Time is indicated in units of sub-frames, such as the "sub-frame 0" shown with reference sign 238. In more detailedness, certain Resource Elements are shown by black and white squares, each of which represents one sub-carrier state for one OFDM symbol.

Reference signals are generated (by the multi-carrier network 100) as a product of an orthogonal sequence and a pseudo-random number. A specific reference signal is assigned to each cell of the multi-carrier network 100. Within a range of radio communication of the device 106, the reference signals uniquely identify each cell. In a Frequency Division Duplex (FDD) scenario as shown in FIG. 4, the squares represent such cell-specific reference signals 240 and 242. The reference signals 240 are always present on the downlink channel in the FDD transmission shown in FIG. 4. The white squares represent reference signals 242, which are sometimes present in the downlink transmission of the non-serving second carrier 104. For determining a (reliable) basis of estimating the received signal power in step 204 (and 204'), the reference signals 240 are preferred (over the reference signals 242). A primary synchronization channel (P-SCH) 244 (shown by a diagonal dash pattern in FIG. 4) comprises primary synchronization signals of the non-serving second carrier 104. A second synchronization channel (S-SCH) 246 (shown by a horizontal dash pattern in FIG. 4) comprises secondary synchronization signals of the non-serving second carrier 104.

A cell search unit (not shown) detects a first cell (on the non-serving second carrier 104) performing a cell search algorithm to the IQ samples received during a previous measurement gap (prior to the first measurement gap 220). In the embodiment shown in FIG. 4, the inter-carrier measurement is a Reference Signal Received Power measurement, or RSRP measurement. In order to avoid a saturation of the receiver 120 due to a too high receiver gain, the initial AGC comprising the steps 202', 212', and 210' (described above with reference to FIG. 3) is performed. In accordance with the step 204' (of the step 212'), the received signal power on the non-serving second carrier 104 is estimated for an initial time interval 248 shown in FIG. 4. The receiver gain is applied in the step 210', which is as shown in FIG. 4 at the end of the initial time interval 248. The initial AGC is thus based on the reference signals 240 on the non-serving second carrier 104 in the initial time interval 248.

After completion of the initial AGC algorithm 212' and application of the receiver gain in step 210', the IQ samples received from the receiver 120 on the non-serving second carrier 104 and buffered for the RSRP measurements of the (previously detected) cell of the non-serving second carrier 104. A second time interval 250 of performing the inter-carrier measurement according the step 208 is shown in FIG. 4. The buffered IQ samples are further input to the cell search unit. The cell search unit is adapted to detect further cells on the non-serving second carrier 104 or any other non-serving carrier.

After the application of the initial receiver gain in the step 210', the AGC algorithm 212 (including the step 204 of estimating the received signal power) for a first time interval 252 is performed in parallel with the sampling according to the step 208. The first time interval 252 is thus fully comprised in the second time interval 250. In the embodiment shown in FIG. 4, the first time interval 252 is determined (in parallel to the initial time interval 248) according to the step 202. The signals received in the second time interval 250 and sampled for the inter-carrier measurement 208 comprise both the reference signals 240 and the reference signals 242.

In the second time interval 250, as long as signal reception on the non-serving second carrier 104 has not yet ended, the sub-steps 202 and 212 are repeated according to the flow diagram shown in FIG. 3. The repeated step 202 determines a further first time interval 254, in which reference signals 240 (as the predefined signal portion) are always present. The repeated AGC algorithm 212 refines the computed receiver gain based on both the first time interval 252 and the further first time interval 254. The (current) receiver gain for the non-serving second carrier 104 is not applied to the receiver 120 within the second time interval 250. The receiver gain resulting from the (repeated) AGC algorithm 212 is not applied until the second measurement gap 226.

The method returns at the end of the second time interval 250 (after stopping the sampling according the sub-step 208b) to the step of waiting for the second measurement gap 226 according to the step 214 shown in FIG. 3. As soon as the signal reception on the non-serving second carrier is resumed (after tuning the receiver 120 in the radio switching time 228), the receiver gain as computed based on the first measurement gap 220 is applied in the second measurement gap 226 in the step 210 (as shown on the right in FIG. 4). The method thus avoids loss of IQ samples during the second time interval 250 of performing the inter-carrier measurement according to the step 208. Furthermore, in the embodiment shown on the right of FIG. 4, the inter-carrier measurement 208 covers the entire effective measurement time 234 of the second measurement gap 226. I.e., the second time interval 256 equals the effective measurement time 234 of the second measurement gap 226. Performing the method regarding the second measurement gap 226) thus leads to an increase in the measurement time available for, e.g., cell search. Performing the method in the second measurement gap 226 includes running the AGC algorithm 212 for further first time intervals 258 and 260, respectively. The receiver gain computed on the basis of the estimated signal power for the first time intervals 258 and 260 is applied after the second time interval 256 according to the step 210. I.e., the receiver gain is applied at the beginning of the effective measurement time of a third measurement gap (not shown). Relative timings of the steps of the method in the third measurement gap correspond to the second measurement gap 226.

Figure 5:
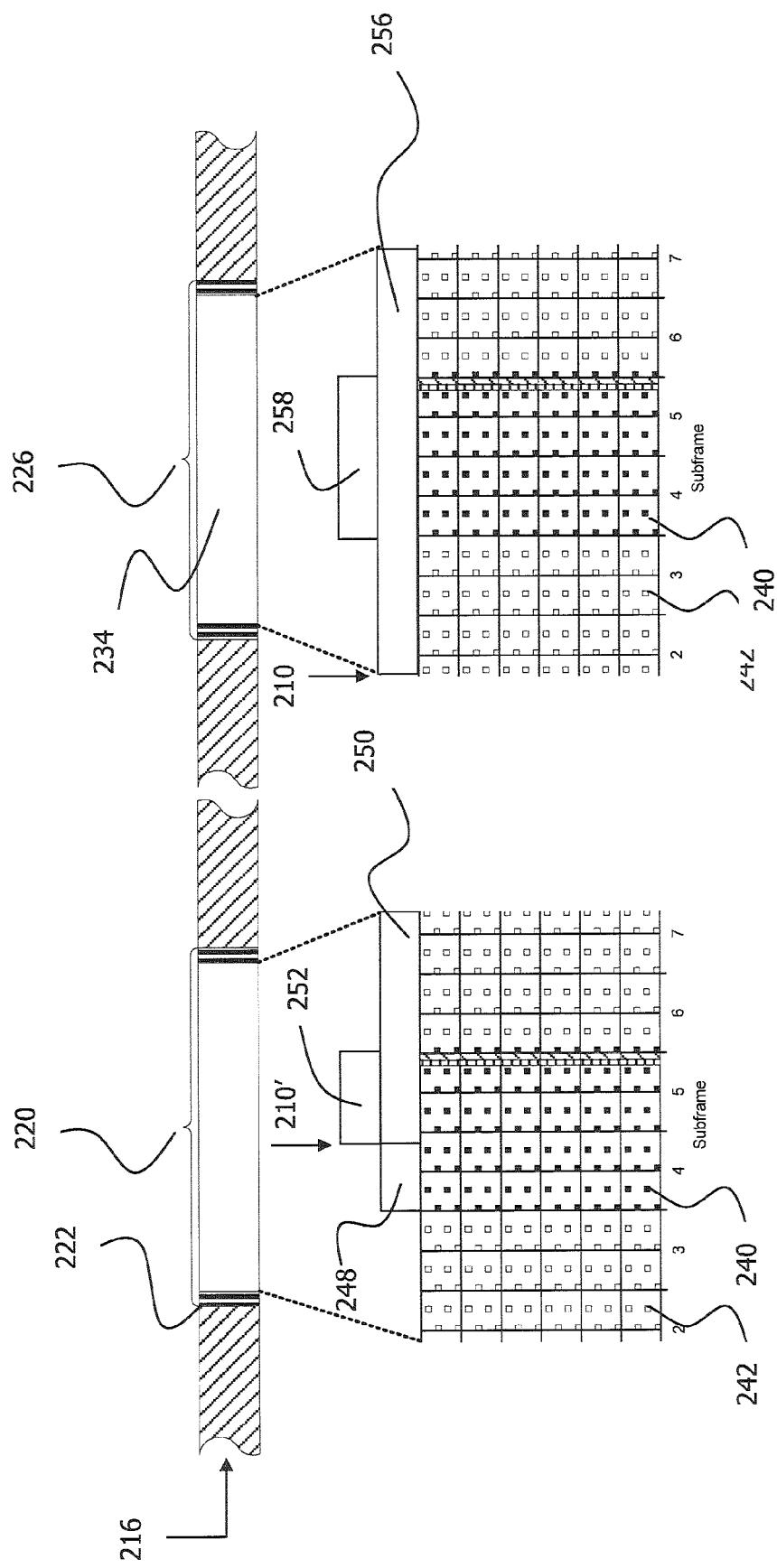
FIG. 5 schematically illustrates time-frequency grids of a Frequency Division Duplex carrier at a second timing relative to measurement gaps.

FIG. 5 schematically illustrates performing the method embodiment illustrated in FIGS. 2 and 3 in a further FDD scenario. The scenario shown in FIG. 5 differs by the relative timing between serving first carrier 102 and non-serving second carrier 104. More specifically, FIG. 5 shows a different timing of the sub-frames as received at the receiver 120 from the detected cell (i.e., as received on the non-serving second carrier 104 including a propagation delay) relative to the start of the (first and second) measurement gaps 220, 226.

The step 214 of waiting for the signal reception ends at the end of the radio switching time 222. In the absence of a receiver gain stored in the receiver gain memory 124 of the receiver 120, an initial time interval 248 is determined in the step 202'. The initial time interval 248 is determined to cover a transmission of scheduled reference signals 240 and not to cover an optional transmission of reference signals 242. The initial AGC algorithm 212' includes estimating for the initial time interval 248 the initial receiver gain, which is applied to the receiver 120 according to the step 210' at the time instance shown in FIG. 5.

A first time interval 252 (which is the only continuous first time interval in the first measurement gap 220) is determined according to the step 202. The first time interval 252 is determined to cover a transmission of scheduled reference signals 240 and not to cover an optional transmission of reference signals 242. The AGC algorithm 212 includes the step 204 of signal power estimation for the first time interval 252. Subsequently, the inter-carrier measurement 208 is started in the sub-step 208a for a second time interval 250. The sampling of the inter-carrier measurement 208 stops according to the step 208b at the end of the second time interval 250. The receiver gain computed in the step 206 is based on the first time interval 252 in the first measurement gap 220. The receiver gain is applied at the beginning of the effective measurement time 234 in the second measurement gap 256 according to the step 210, which is shown on the left of FIG. 5.

Performing the method embodiment in relation to the second measurement gap 256 thus allows for an inter-carrier measurement over a second time interval 256 in the second measurement gap 226 covering the full effective measurement time 234. The step 202 of determining a first time interval (comprising the reference signals 240 as the predefined signal portion) yields a further first time interval 258 (which is the only continuous first time interval in the second measurement gap 220).

Figure 6:
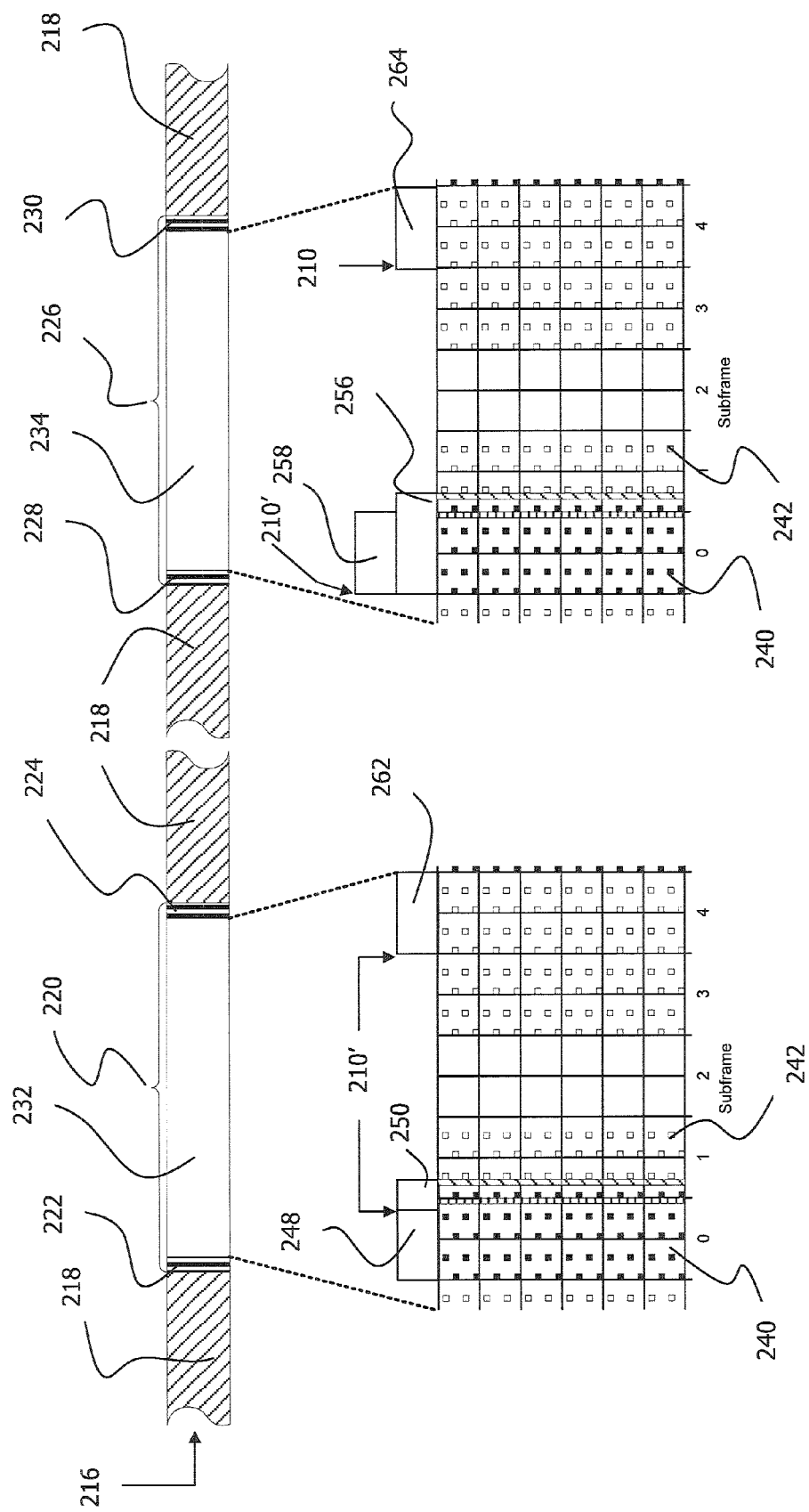
FIG. 6 schematically illustrates time-frequency grids of a Time Division Duplex carrier at a first timing relative to measurement gaps.
Figure 7:
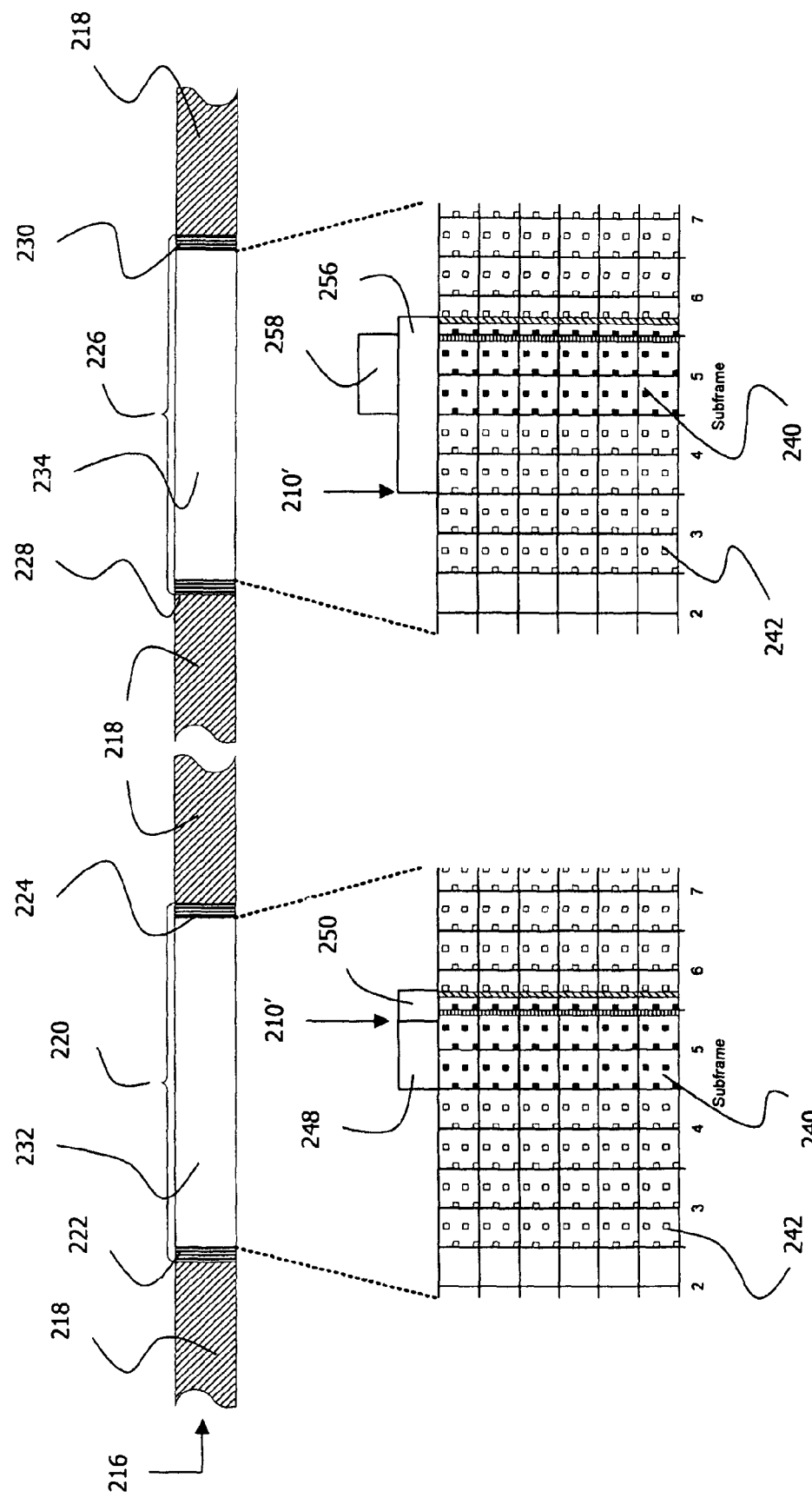
FIG. 7 schematically illustrates time-frequency grids of a Time Division Duplex carrier at a second timing relative to measurement gaps.

The FIGS. 6 and 7 schematically illustrate performing the method embodiment of FIGS. 2 and 3 in Time Division Duplex (TDD) scenarios. A first TDD scenario shown in FIG. 6 differs from a second TDD scenario shown in FIG. 7 by the relative timing of the detected cell (of the non-serving second carrier 104) to the start of a first measurement gap 220 (and a second measurement gap 226). Throughout, like reference signs refer to corresponding features (described above with reference to FIG. 1) or method steps (described above with reference to at least one of the FIGS. 2 to 5).

The method determines in the step 202' an initial time interval 248. Reference signals 240 known (to the device 106) to be scheduled on the non-serving second carrier 104 are representative for the received signal power on the non-serving second carrier 104. The received signal power is estimated in the initial time interval according to step 204' (as part of the initial AGC algorithm 212'). After computation of a receiver gain based on the estimated signal power in the step 206', the computed receiver gain is applied in the step 210', which is shown on the left of FIG. 6.

In the case of TDD (shown in the FIGS. 6 and 7), a minimum number of sub-frames carrying reference signals 240 (as the predefined signal portion) is lower than for above FDD scenarios (shown in the FIGS. 4 and 5). For the step 204 of signal power estimation, a first time interval determined in the step 202 is required to comprise reference signals 240. Furthermore, the first time interval is required to span a minimum time of one slot (i.e., 0.5 ms). The minimum time requirement improves statistics of the measured signal power. Consequently, the step 202 determines no first time interval within the first measurement gap 220.

A second time interval 250 for the inter-carrier measurement 208 is also required to comprise a transmission of the reference signals 240. No minimum time requirement applies to the second time interval 250. The sub-frames 1 and 2 of the non-serving second carrier 104 are not used for the inter-carrier measurement (i.e., the RSRP measurement) in the step 208. The inter-carrier measurement is interrupted within the first measurement gap 220. The effective measurement time 232 of the first measurement gap 220 thus comprises (in addition to the second time interval 250) a further second time interval 262. It is not known (to the device 106) whether the slots of the second time interval 262 actually carries any predefined signal portion representative of received signal power (such as the reference signals 240). The slots (or sub-frames) of second time interval 262 could also be scheduled for an uplink channel or allocated to an MBSFN transmission (which is not suitable as a predefined signal portion and not representative for received signal power). Consequently, the second time interval 262 is sampled for the inter-carrier measurement according to the step 208. The sub-frame 4 is, however, not used as input to the estimation unit 110 and is not a basis for a received signal power estimate according to the step 204. The first measurement gap 220 of the TDD scenario shown in FIG. 6 is thus an example of the second time interval 250 and the further second time interval 262 being in the same measurement gap 220.

A first time interval 258 is determined in the step 202 for the second measurement gap 226. Based on the receiver gain applied in the step 210', IQ samples are buffered over a second time interval 256 for the inter-carrier measurement according to the step 208. Simultaneously, the AGC algorithm 212 is applied to the first time interval 258 (using the same IQ samples). The receiver gain computed by the AGC algorithm 212 is applied after the second time interval 256 and prior to the next inter-carrier measurement in a further second time interval 264. As indicated for the second measurement gap 226 in FIG. 6, the receiver gain (resulting from the AGC algorithm 212) based on the first time interval 258 is applied immediately prior to the further second time interval 264. The second measurement gap 226 of the TDD scenario shown in FIG. 6 is thus an example of the first time interval 258 and the (further) second time interval being in the same measurement gap 226.

A different relative timing between the serving first carrier 102 (scheduling the measurement gaps 220 and 226) and the sub-frame timing (scheduled by the non-serving second carrier 104) is shown in FIG. 7. In the TDD scenario of FIG. 7, the initial AGC algorithm 212' is based on an initial time interval 248 and the resulting initial receiver gain is applied in the step 210' prior to the inter-carrier measurement according to the step 208 in a second time interval 250. The receiver gain computed in step 206' based on the initial time interval 248 in the first measurement gap 220 is applied prior to the second time interval 250 in the first measurement gap 220 and prior to a second time interval 256 in the second measurement gap 226. In parallel to the inter-carrier measurement according to the step 208 over the second time interval 256, the AGC algorithm 212 is applied to a first time interval 258 in the second measurement gap 226. The first time interval 258 is fully inside the second time interval 256. More specifically, the first time interval 258 is a section of the second time interval 256 comprising the reference signals 240. Thus, a reliable signal power estimate is based on a subset of the IQ samples. The receiver gain computed in the step 206 based on the estimated signal power for the first time interval 258 is applied prior to the beginning of a second time interval in a third measurement gap (not shown).

Additional sub-frames, such as the sub-frame 4 shown in FIGS. 6 and 7 (or sub-frame 9, which is not shown) may be sampled and buffered as further input to the cell search unit. The measurement unit is adapted to detect whether the additional sub-frames actually carry reference signals 242, in which case these signals can be further used for the RSRP measurement 208.

Above scenarios shown in FIGS. 4 to 7 have been described for the case of synchronized (serving and non-serving) carriers 102 and 104. In the case of synchronized carriers, the device 106 can determine a first time interval and a second time interval based on a (previously determined) sub-frame timing of the non-serving second carrier 104 (relative to the measurement gaps on the serving first carrier 102). Otherwise, periodic measurement gaps 220, 226 and/or synchronized carriers (or synchronized cells) are not a general requirement. The step 202 of determining a first time interval (comprising a predefined signal portion) requires the device 106 to determine an inter-carrier timing (i.e., an absolute timing of sub-frames on the non-serving second carrier 104, or a relative timing between the serving carrier and the non-serving carrier). The inter-carrier timing is acquired by the device 106 using the initial AGC algorithm 212 and a cell search algorithm.

In the case of detecting several cells (or several non-serving carriers), the technique as described is applied to the non-serving cell (or the non-serving carrier) having the strongest signal (i.e., highest received signal power) in order to prevent saturation (which might occur if the receiver gain is based on a cell or carrier having a weaker signal during a time at which a cell or carrier having the strongest signal is not transmitting to and/or expecting transmissions from the mobile terminal).

In the scenarios described with reference to the FIGS. 4 to 7, the step 210 of applying the receiver gain is synchronized relative to the first and second measurement gaps (scheduled by the serving first carrier 102). Alternatively or in addition the step 210 is synchronized to (or coincides with) borders of at least one of the sub-frames of the non-serving second carrier 104, the first time interval of the step 204, and the second time interval of the step 208. As a further alternatively, the time of receiver gain application according to the step 210 can be varied in each of the measurement gaps 220, 226 (and all follow measurement gaps). As an advantage, the signals affected or even destroyed due to the receiver gain application are different in different measurement gaps 220, 226 (and all follow measurement gaps). This allows detecting still further non-serving cells (or non-serving carriers), which would otherwise (i.e., in the case of a regular or periodic timing of the step 210) not be found or lost (due to the perturbed signal reception).

As has become apparent from the above description of exemplary embodiments, by carefully selecting which part (or parts) of each of the measurement gaps 220, 226 are determined according to the step 202 as input to the AGC algorithm 212, a risk of saturation of the IQ samples in the receiver 120 is reduced. Thus, an associated loss of inter-carrier measurement performance is reduced. Moreover, by carefully timing the step 210 of applying the receiver gain to the receiver 120 after the second time interval, an impact on the inter-carrier measurement of the step 208 due to a changing receiver gain can be reduced or even eliminated.

It is believed that many advantages of the present invention will be fully understood from the forgoing description, and it will be apparent that various changes may be made in the form, construction and arrangement of the exemplary aspects thereof without departing from the scope of the invention or without sacrificing all of its advantages. Because the invention can be varied in many ways, it will be recognized that the invention should be limited only by the scope of the following claims.

The invention claimed is:

1. A method of performing Automatic Gain Control (AGC) for a receiver of a device being served on a serving carrier of a multi-carrier communication network, measurement gaps being scheduled on the serving carrier for inter-carrier measurements on a non-serving carrier, the method comprising:

determining a first time interval in which a predefined signal portion is transmitted on the non-serving carrier;

estimating, for the first time interval, received signal power on the non-serving carrier;

computing a receiver gain based on the estimated signal power;

performing, over a second time interval, an inter-carrier measurement on the non-serving carrier, the first time interval and the second time interval are inside a same first measurement gap; and applying the receiver gain to the receiver after the second time interval.

2. The method of claim 1, wherein one of the second time interval adjacently follows the first time interval, the second time interval fully encompasses the first time interval, and the first time interval and the second time interval overlap partially.

3. The method of claim 1, wherein the receiver gain is applied to the receiver in a second measurement gap.

4. The method of claim 3, wherein the receiver gain is applied to the receiver at the beginning of the second measurement gap.

5. The method of claim 1, wherein the method is at least partially repeated including applying corresponding receiver gains to the receiver in different measurement gaps, each of the applying of corresponding receiver gains occurring at a different time offset relative to the corresponding measurement gap of the applying of the corresponding receiver gain.

6. The method of claim 1, wherein the first time interval is inside the first measurement gap and defines a time frame relative to the first measurement gap, and the receiver gain being applied to the receiver in a second measurement gap at a time offset relative to the second measurement gap that is outside the time frame.

7. The method of claim 1, wherein the measurement gaps are consecutively scheduled on the serving carrier.

8. The method of claim 1, wherein the predefined signal portion is representative of the received signal power on the non-serving carrier.

9. The method of claim 1, wherein the predefined signal portion comprises at least one of a reference signal and a synchronization signal on the non-serving carrier.

10. The method of claim 1, further comprising at the beginning of each of the measurement gaps at least one of tuning the receiver to a carrier frequency other than the one of the serving carrier and switching to a radio access technology other than the one of the serving carrier.

11. The method of claim 1, wherein performing the inter-carrier measurement includes the steps of sampling signals received on the non-serving carrier and buffering the sampled signals for cell search evaluation.

12. The method of claim 11, wherein the sampled signals comprise reference signals.

13. The method of claim 1, further comprising at least one of applying an initial receiver gain immediately prior to performing the inter-carrier measurement and performing a further inter-carrier measurement immediately following the applying of the initial receiver gain.

14. The method of claim 13, wherein the predefined signal portion comprises at least one of a reference signal and a synchronization signal on the non-serving carrier.

15. A computer program product stored on a non-transitory device-readable medium comprising program code portions for performing Automatic Gain Control (AGC) for a receiver of a device being served on a serving carrier of a multi-carrier communication network, measurement gaps being scheduled on the serving carrier for inter-carrier measurements on a non-serving carrier, the program code portions, when executed on a processor of the device, cause the device to:

determine a first time interval in which a predefined signal portion is transmitted on the non-serving carrier;

estimate, for the first time interval, received signal power on the non-serving carrier;

compute a receiver gain based on the estimated signal power;

perform, over a second time interval, an inter-carrier measurement on the non-serving carrier, the first time interval and the second time interval are inside a same first measurement gap; and apply the receiver gain to the receiver after the second time interval.

16. A device configured to perform Automatic Gain Control (AGC) for a receiver, the device being served on a serving carrier of a multi-carrier communication network and measurement gaps are scheduled on the serving carrier for inter-carrier measurements on a non-serving carrier, the device comprising:

a determination unit configured to determine a first time interval in which a predefined signal portion is transmitted on the non-serving carrier;

an estimation unit configured to estimate, for the first time interval, received signal power on the non-serving carrier;

a processing unit configured to compute a receiver gain based on the estimated signal power;

a measurement unit configured to perform, over a second time interval, an inter-carrier measurement on the non-serving carrier, the first time interval and the second time interval are inside a same first measurement gap; and an application unit configured to apply the receiver gain to the receiver after the second time interval.

17. The device of claim 16, wherein one of: all units are and at least one of the units is operated in more than one of the measurement gaps including the application unit being further configured to apply corresponding receiver gains to the receiver in different measurement gaps, each of the applying of corresponding receiver gains occurring at a different time offset relative to the corresponding measurement gap of the applying of the corresponding receiver gain.

18. The device of claim 16, wherein one of the second time interval adjacently follows the first time interval, the second time interval fully encompasses the first time interval, and the first time interval and the second time interval partially overlap.

19. The device of claim 18, wherein one of: all units are and at least one of the units is operated in more than one of the measurement gaps including the application unit being further configured to apply corresponding receiver gains to the receiver in different measurement gaps, each of the applying of the corresponding receiver gains occurring at a different time offset relative to the corresponding measurement gap of the applying of the corresponding receiver gain.

* * * * *

UNITED STATES PATENT AND TRADEMARK OFFICE
CERTIFICATE OF CORRECTION

| | | |
|---|---|---|
| PATENT NO. | : 9,031,175 B2 | |
| APPLICATION NO. | : 14/112754 | |
| DATED | : May 12, 2015 | |
| INVENTOR(S) | : Alriksson et al. | |

It is certified that error appears in the above-identified patent and that said Letters Patent is hereby corrected as shown below:

On the title page,

On Page 2, item (56), under "FOREIGN PATENT DOCUMENTS", in Column 1, Line 2, delete "EP 1583232 A2 10/2005".

On Page 2, item (56), under "FOREIGN PATENT DOCUMENTS", in Column 1, Line 2, insert -- CN 1954519 A1 4/2007 --.

On Page 2, item (56), under "OTHER PUBLICATIONS", in Column 2, Line 1, insert -- Chinese Office Action and its English translation dated October 8, 2014 for corresponding Chinese Application No: 201280018467.8 Chinese Filing Date April 13, 2012, consisting of 9-pages. --.

In the specification,

In Column 6, Line 63, delete "Circult" and insert -- Circuit: --, therefor.

In Column 10, Line 28, delete "receive" and insert -- receiver --, therefor.

In Column 11, Line 64, delete "216" and insert -- 226 --, therefor.

In Column 14, Line 18, delete "256" and insert -- 226 --, therefor.

In Column 14, Line 21, delete "256" and insert -- 226 --, therefor.

In the claims,

In Column 17, Line 15, in Claim 2, delete "one of" and insert -- one of: --, therefor.

In Column 18, Line 43, in Claim 17, delete "units are" and insert -- units --, therefor.

In Column 18, Line 51, in Claim 18, delete "one of" and insert -- one of: --, therefor.

In Column 18, Line 56, in Claim 19, delete "units are" and insert -- units --, therefor.

Signed and Sealed this
Seventeenth Day of May, 2016

Michelle K. Lee
*Director of the United States Patent and Trademark Office*